United States Patent [19]
Kanda

[11] Patent Number: 6,144,592
[45] Date of Patent: Nov. 7, 2000

[54] SEMICONDUCTOR MEMORY DEVICE HAVING A REDUNDANT MEMORY

[75] Inventor: Kazushige Kanda, Kawasaki, Japan

[73] Assignee: Kabushiki Kaisha Toshiba, Kawasaki, Japan

[21] Appl. No.: 09/327,179

[22] Filed: Jun. 7, 1999

[30] Foreign Application Priority Data

Jun. 8, 1998 [JP] Japan .................................. 10-159202

[51] Int. Cl.⁷ ..................................................... G11C 7/00
[52] U.S. Cl. ........................................... 365/200; 365/201
[58] Field of Search .................................. 365/200, 201, 365/189.07, 210, 189.02

[56] References Cited

U.S. PATENT DOCUMENTS 5,818,771 10/1998 Yasu et al. ................................ 365/145
5,970,001 10/1999 Noda et al. .............................. 365/200

FOREIGN PATENT DOCUMENTS 6-28891 2/1994 Japan .
10-302497 11/1998 Japan .

*Primary Examiner*—David Nelms
*Assistant Examiner*—David Lam
*Attorney, Agent, or Firm*—Banner & Witcoff, Ltd.

[57] ABSTRACT

An internal address signal generation circuit generates an internal address signal necessary for accessing a memory cell array. A defective address storage circuit stores a defective address signal of the memory cell array. A first comparison circuit compares the internal address signal and defective address signal. A latch circuit latches a redundant testing address signal supplied from outside. A second comparison circuit compares the redundant testing address signal and the internal address signal. A selection circuit selects an output signal of the second comparison circuit in a redundant test mode. In response to the selected output signal, part of the memory cell array is replaced with a redundant memory cell array.

21 Claims, 10 Drawing Sheets

SEMICONDUCTOR MEMORY DEVICE HAVING A REDUNDANT MEMORY

BACKGROUND OF THE INVENTION

The present invention relates to a semiconductor memory device such as an EEPROM and, more specifically, to a redundant memory test circuit for testing a redundant memory of the device.

FIG. 11 is a block diagram showing an example of an arrangement of an address control circuit of a conventional semiconductor memory. The address control circuit includes a redundant control circuit. In this circuit, an input buffer 1 receives an address signal (Add) from outside through an I/O pin (not shown). An internal address signal generation circuit 2 includes a multiplexer and an address counter (not shown). Upon receiving the address signal from the input buffer 1, the multiplexer sets the address signal to the address counter as an access start address. The circuit 2 generates internal address signals A1 to A3 based on the access start address.

An address decoder 3 accesses a memory cell array (not shown), while a redundant address decoder 4 does a redundant memory cell array (not shown). A defective address storage circuit 5 has a fuse element group for storing defective address signals (fuse data) of the memory cell array. An address comparison circuit 6 compares the defective address signals stored in the circuit 5 and the internal address signals output from the internal address signal generation circuit 2, and controls the address decoder 3 and redundant address decoder 4 based on the comparison results.

To access the memory cell array in the address control circuit so arranged, an externally-input access start address is usually set in the address counter of the internal address signal generation circuit 2 through the input buffer 1.

The address counter counts up addresses in synchronization with read and write pulses supplied from outside and generates the address signals A1 to A3 (which are encoded in accordance with address values) having the number of bits according to an address space.

The address decoder 3 includes a row decoder and a column decoder, and these decoders decode the internal address signals to select a word line and a bit line corresponding to an address.

The address comparison circuit 6 compares the defective address signals and the internal address signals. When they coincide with each other, the circuit 6 outputs both a select inhibit signal SIS for setting the memory cell array in a nonselective state and a select signal /SS (/ indicates an inverted signal hereinafter) for setting the redundant memory cell array in a selective state. The select inhibit signal SIS is supplied to the address decoder 3, and the select signal /SS is supplied to the redundant address decoder 4. Thus, a defective block (defective row or defective column) of the memory cell array is replaced with a redundant block (redundant row or redundant column) of the redundant memory cell array.

FIG. 12 illustrates an example of the address comparison circuit 6 and the defective address storage circuit of FIG. 11. This example is adapted to a plurality of redundant address decoders 4 and, in other words, a plurality of address comparison circuits 62 to 64 are provided to compare a plurality of redundant addresses. A logic circuit 65 is also provided at the output terminals of the comparison circuits 62 to 64 to receive output signals /SRD1 to /SRD3 of these circuits 62 to 64.

The logic circuit 65 supplies the output signals /SRD1 to /SRD3 to the plural redundant address decoders 4 as select signals /SS (enable signals). Further, the circuit 65 includes a NAND gate 66 supplied with the output signals /SRD1 to /SRD3. The NAND gate 66 sends a select inhibit signal SIS (disable signal) to the address decoder 3 when at least one of the output signals /SRD1 to /SRD3 is activated.

In each of the comparison circuits 62 to 64, (A1, /A1), (A2, /A2), and (A3, /A3) are signals of bits constituting the internal address signals and their complementary signals, and they are supplied to the gates of N-channel MOS transistors Q, respectively. A fuse F is connected in series to each of the transistors Q to form a discharge pass. These transistors Q and fuses F constitute series circuits, and these circuits are each connected between a node N and a ground potential Vss and in parallel with each other. A charge pass of a P-channel MOS transistor P whose gate is supplied with a precharge signal PRE, is connected between each of the node N and a power supply potential Vcc.

The discharge passes are set so as to cause a current i2, which is larger than a current i1 of the discharge pass, to flow through the node N. The fuses F are blown or unburned in accordance with the content of each bit of the defective address signal. The potential of the node N is inverted by an inverter circuit IV and supplied as the above output signal /SRDi (i=1, 2 and 3).

If none of the fuses F are blown, at least one discharge pass is formed and thus the node N is set at a ground potential Vss (low level).

In the case shown in FIG. 13 where some fuses F are blown, if there is one difference between the content of each bit of data set in the plural fuses F and that of each of bit signals A1, /A1, A2, /A2, A3 and /A3, at least one discharge pass is formed. In other words, since no fuse is blown in the transistor supplied with the bit signal A1 of high level, a discharge pass is formed in the series circuit and thus the node N is set at a low level.

In contrast, as illustrated in FIG. 14, when the contents of bits of fuse data all coincide with those of bit signals A1, /A1, A2, /A2, A3 and /A3, no discharge pass is formed and thus the node N is set at the power supply potential Vcc (high level). If the node N is set at the high level, the address decoder 3 is disabled and the redundant address decoder 4 is enabled. A defective block of the memory cell array is therefore replaced with a redundant block.

In the foregoing semiconductor memory, when a defective block is detected from the memory cell array in a test during its manufacturing, a fuse F (e.g., polysilicon fuse) is blown. Thus, an intrinsic defective (incapable of a basic operation such as erase, write and read operations) can be removed from the memory cell array, and a memory device can be finished as a defect-free one.

If, however, a defective block is replaced with a redundant one in order to evaluate a device (chip or chip area) in detail during the development or manufacturing of memories, a fuse F has to be blown as described above. To blow the fuse, however, an apparatus exclusively for blowing a fuse or a laser beam is required, resulting in time and trouble in evaluating the device.

It is preferable that a device be changed into a completely defect-free one by replacing a defective block with a redundant block. If, however, there are a number of defective blocks, all of them are not replaced with redundant ones but some intrinsic defects remain. Since yields are low at an early stage of development of memories, a reliability test cannot be carried out sufficiently only by the defect-free devices. It is thus necessary to conduct a reliability test using chips including intrinsic defects; however, reliability defects and intrinsic defects are mixed with each other and thus only the reliability defects are difficult to extract.

The number of intrinsic defects is small at the stage where the yields of memories become stable. The reliability is evaluated after a fuse F is blown to replace a defective block with a redundant block. If, however, the fuse F is blown once, an address is switched automatically in a memory to perform the replacement. It is thus impossible to know how defective a cell is before it is replaced. If an erase voltage or a write voltage is decreased in an operation mode of a memory for accessing a defective cell before it is replaced or in an operation for erasing/writing all data from/to a chip in an EEPROM, it cannot be checked whether the voltage decrease is due to a defective cell which has not yet been replaced.

If a fuse F is blown and a defective block is replaced with a redundant one, defective data before the replacement cannot be reproduced. If, therefore, a defect is present in a redundant block, it is difficult to detect whether the memory cell array or the redundant circuit is defective. Consequently, the analysis of defects in a memory is difficult or delayed.

BRIEF SUMMARY OF THE INVENTION

An object of the present invention is to provide a semiconductor memory device which has a redundant test mode for replacing a defective block with a redundant block using an externally-input address, irrespective of a fuse element or a nonvolatile memory cell for storing a defective address, and which is capable of easily performing the replacement and achieving and evaluating a sample free of an intrinsic defective.

The above object is attained by the following device.

According to a first aspect of the present invention, there is provided a semiconductor memory device comprising a memory cell array having a plurality of memory cells, a redundant memory cell array with which part of the memory cell array is replaced, the redundant memory cell array having a plurality of memory cells, an internal address signal generation circuit for generating an internal address signal for accessing the memory cell array, in response to an address signal supplied from outside, a defective address storage circuit for storing a defective address signal for replacing the part of the memory cell array, first address comparison circuit for comparing the internal address signal generated from the internal address signal generation circuit and the defective address signal stored in the defective address storage circuit; and a redundant memory test circuit for testing the redundant memory cell array, the redundant memory test circuit holding an address signal of the memory cell array, and setting the memory cell array in a nonselective state and setting the redundant memory cell array in a selective state when the address signal held in the redundant memory test circuit and the internal address signal generated from the internal address signal generation circuit coincide with each other.

According to a second aspect of the present invention, there is provided a semiconductor memory device comprising a memory cell array having a plurality of memory cells, an internal address signal generation circuit for generating an internal address signal for accessing the memory cell array, a protect circuit for protecting the memory cell array, the protect circuit holding an address signal of the memory cell array, and inhibiting access to at least part of the memory cell array when the address signal held in the protect circuit and the internal address signal generated from the internal address signal generation circuit coincide with each other.

According to a third aspect of the present invention, there is provided a semiconductor memory device comprising a memory cell array having a plurality of memory cells, a redundant memory cell array with which part of the memory cell array is replaced, an internal address signal generation circuit for generating an internal address signal necessary for accessing the memory cell array upon receiving an address signal from outside, a defective address storage circuit for storing a defective address signal for replacing the part of the memory cell array, a first comparison circuit for comparing the internal address signal generated from the internal address signal generation circuit and the defective address signal stored in the defective address storage circuit, the first comparison circuit outputting a coincidence signal for replacing the part of the memory cell array, a redundant memory test circuit for testing the redundant memory cell array, the redundant memory test circuit holding an address signal of the memory cell array, and setting the memory cell array in a nonselective state and setting the redundant memory cell array in a selective state when the address signal held in the redundant memory test circuit and the internal address signal generated from the internal address signal generation circuit coincide with each other, and a protect circuit for protecting the memory cell array, the protect circuit holding an address signal of the memory cell array, and inhibiting access to at least part of the memory cell array when the address signal held in the protect circuit and the internal address signal generated from the internal address signal generation circuit coincide with each other.

The above-described semiconductor memory device includes a redundant memory test circuit for testing a redundant memory cell array. This circuit holds an address signal of a memory cell array. When the address signal coincides with an internal address signal supplied from the internal address signal generation circuit, the redundant memory test circuit sets the memory cell array in a nonselective state and sets the redundant memory cell array in a selective state. Part of the memory cell array can thus be easily replaced with the redundant memory cell array, irrespective of a defective address stored in the defective address storage circuit. Consequently, at an early stage of development of semiconductor memories, a sample free of an intrinsic defect can easily be achieved and evaluated and a reliability test of devices can be carried out with reliability.

The above-described semiconductor memory device also includes a protect circuit for protecting a memory cell array. The protect circuit holds an address signal of the memory cell array. When the address signal coincides with an internal address signal supplied from the internal address signal generation circuit, the protect circuit inhibits access to at least part of the memory cell array. The memory cell array can thus be protected as desired.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

Figure 1:
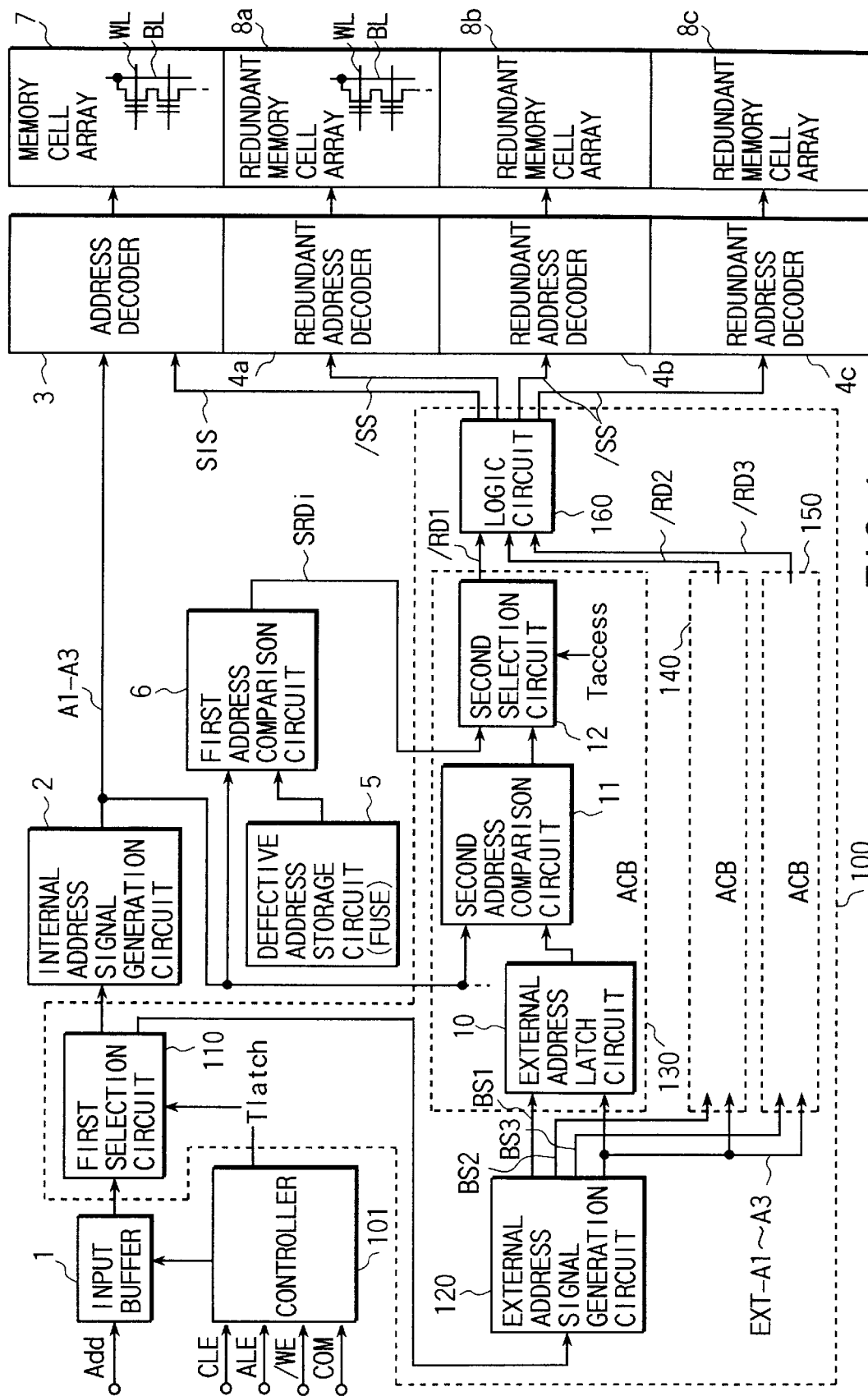
FIG. 1 is a block diagram illustrating a semiconductor memory according to a first embodiment of the present invention.

FIG. 1 schematically shows a semiconductor memory according to a first embodiment of the present invention. In the first embodiment, a redundant memory test circuit 100 and a controller 101 are added to the semiconductor memory illustrated in FIG. 1. The circuit 100 tests a redundant memory cell array in a redundant test mode. The controller 101 controls the whole operation of the semiconductor memory in response to a command latch enable signal CLE, an address latch enable signal ALE, a write enable signal /WE, and a command signal COM. The command signal COM may be supplied to the controller 101 through the input buffer 1.

In the semiconductor memory, an input buffer 1 receives an address signal Add from outside through an I/O pin and is connected to an internal address signal generation circuit 2 through a first selection circuit 110 (described later). The circuit 2 receives an output signal from the input buffer 1 via the first selection circuit 110 and generates internal address signals A1 to A3.

An address decoder 3 accesses a memory cell array 7 based on the internal address signals A1 to A3 supplied from the internal address signal generation circuit 2, while redundant address decoders 4a to 4c access redundant memory cell arrays 8a to 8c, respectively. The memory cell array 7 and redundant memory cell arrays 8a to 8c are each constituted of, e.g., NAND type EEPROM cells. These NAND type EEPROM cells include a plurality of series-connected EEPROM cells, word lines connected to the control gate of the EEPROM cells, and bit lines each connected to one end of its corresponding EEPROM cell. The memory cell array 7 and redundant memory cell arrays 8a to 8c are not limited to the above arrangement but can be replaced with NOR type EEPROM cells or other memory cells.

A defective address storage circuit 5 includes a fuse element group in which a defective address of the memory cell array is stored. Not only a fuse element but a nonvolatile semiconductor memory cell can be used as a cell for storing a defective address.

Figure 12:
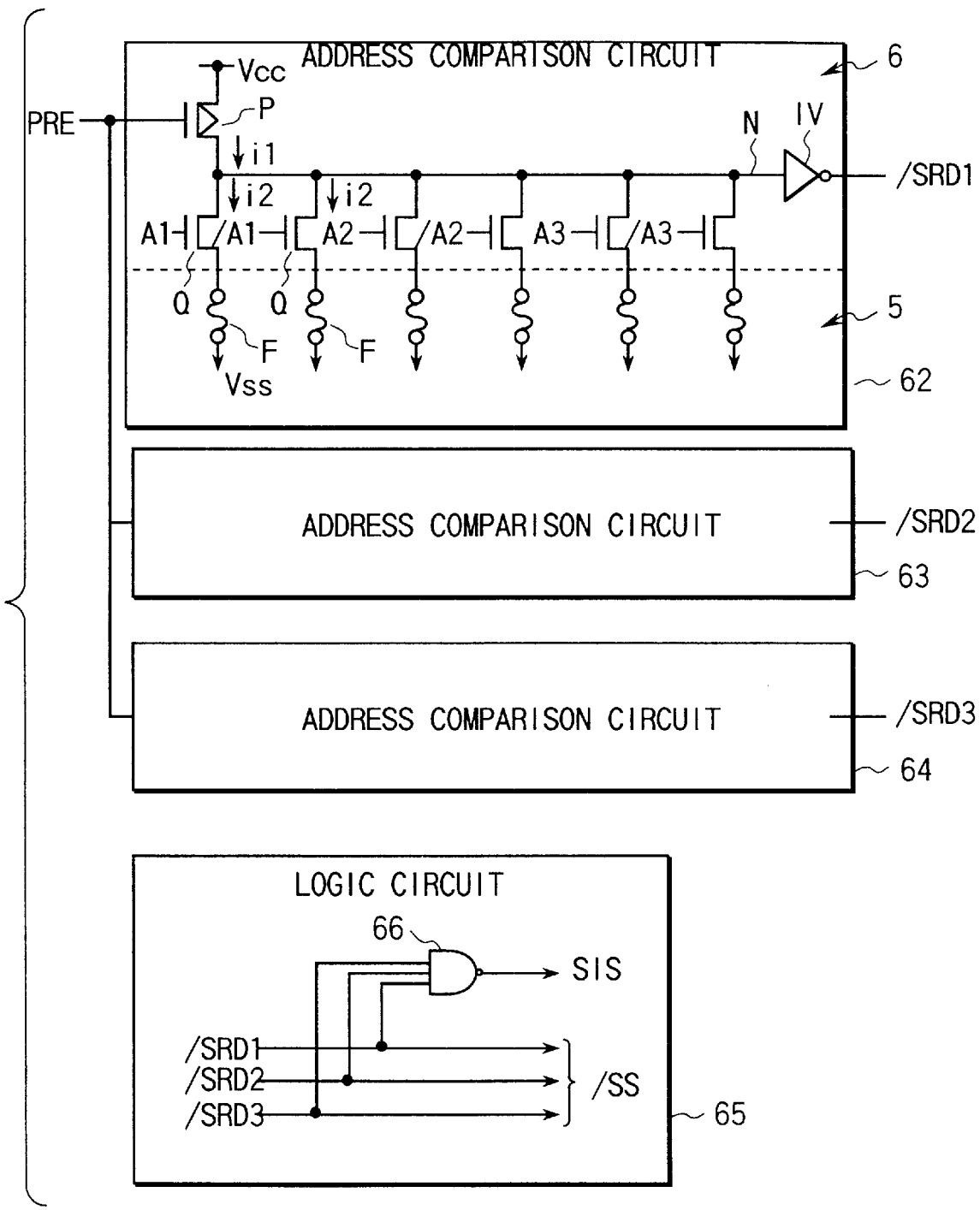
FIG. 12 is a circuit diagram showing an example of an address comparison circuit and a defective address storage circuit of the semiconductor memory of FIG. 11.
Figure 13:
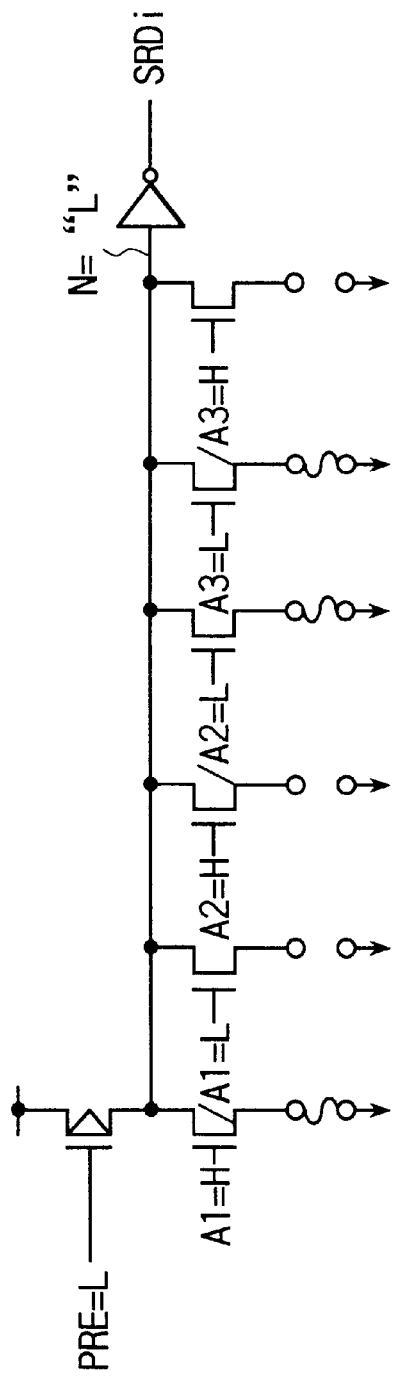
FIG. 13 is a circuit diagram showing an example of an operation of the address comparison circuit of FIG. 12.
Figure 14:
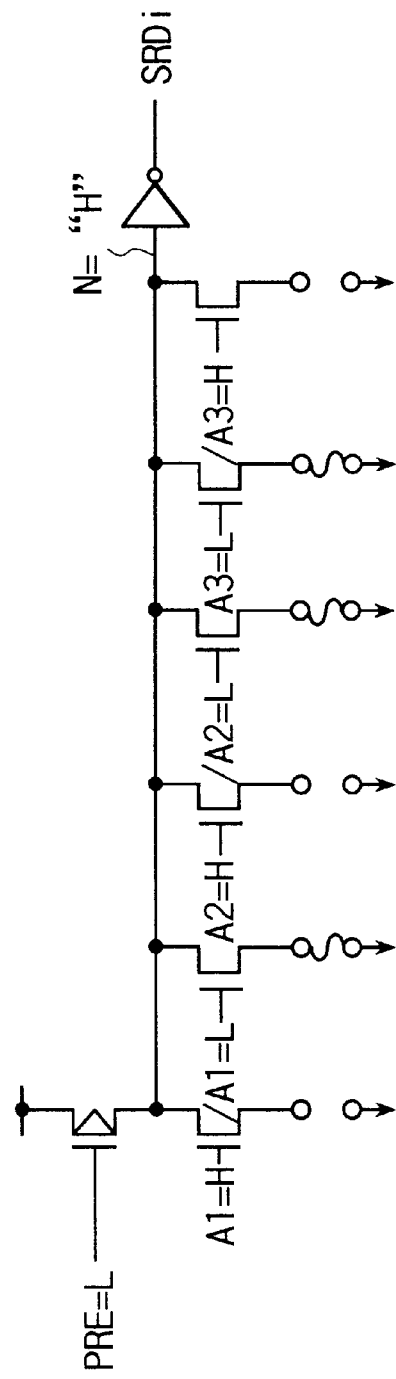
FIG. 14 is a circuit diagram showing another example of the operation of the address comparison circuit of FIG. 12.

A first address comparison circuit 6 compares a defective address signal (fuse data) stored in the defective address storage circuit 5 with the internal address signals A1 to A3 supplied from the internal address signal generation circuit 2, and outputs a signal corresponding to a result of the comparison. This signal is supplied to a second selection circuit 12 (described later). The first address comparison circuit 6 and the defective address storage circuit 5 can be constituted as illustrated in FIG. 12.

The redundant memory test circuit 100 includes the first selection circuit 110, an external address signal generation circuit 120, address control blocks (ACB) 130, 140 and 150, and a logic circuit 160. Each of the address control blocks has an external address latch circuit 10, a second address comparison circuit 11, and the second selection circuit 12.

The first selection circuit 110 supplies an output signal of the input buffer to the internal address signal generation circuit 2 or the external address signal generation circuit 120 in response to an address latch signal for a redundant test mode. More specifically, the first selection circuit 110 supplies an output signal of the input buffer 1 to the internal address signal generation circuit 2 in a normal mode in which the memory cell array 7 is accessed, while the circuit 110 supplies it to the external address signal generation circuit 120 in a redundant test mode in which the redundant memory cell array is accessed.

In the redundant test mode, the circuit 120 sequentially outputs block select signals BS1, BS2 and BS3 for selecting the address control blocks 130, 140 and 150 in response to an address signal supplied from the first selection circuit 110. The circuit 120 also supplies address signals, which are sent from the circuit 110, to a selected one of the address control blocks as external address signals EXT-A1 to EXT-A3 for testing the redundant memory cell array.

The external address latch circuit 10 latches the external address signals EXT-A1 to EXT-A3 supplied from the external address signal generation circuit 120.

The second address comparison circuit 11 compares the signals EXT-A1 to EXT-A3 latched by the circuit 10 and the internal address signals A1 to A3 supplied from the circuit 2.

The second selection circuit 12 selects an output of the first address comparison circuit 6 or an output of the second address comparison circuit 11 in response to a redundant test mode signal Taccess.

When at least one of output signals of the second selection circuits 12 of the address control blocks 130, 140 and 150 is activated, the logic circuit 160 supplies a select inhibit signal SIS to the address decoder 3 to set the memory cell array 7 in a nonselective state and supplies select signals /SS to the redundant address decoders 4a to 4c to set their corresponding redundant memory cell arrays 8a to 8c in a selective state.

Figure 2:
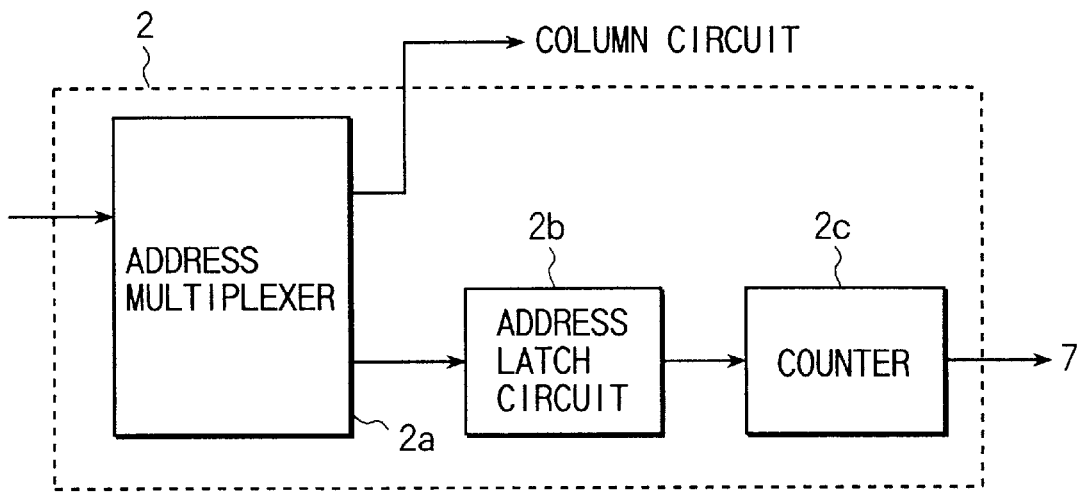
FIG. 2 is a block diagram showing an example of an internal address signal generation circuit of the semiconductor memory illustrated in FIG. 1.

FIG. 2 illustrates the internal address signal generation circuit 2. This circuit 2 includes an address multiplexer 2a, an address latch circuit 2b, and a counter 2c. The address multiplexer 2a is supplied with column and row address signals in sequence through the first selection circuit 110 in accordance with a toggle operation of a write enable signal (described later). These address signals are, for example, access start addresses. The address multiplexer 2a sorts the address signals into column and row address signals in the order they are input. Assuming that the address decoder 3 and redundant address decoders 4a to 4c shown in FIG. 1 are row system circuits, the column address signals are supplied to a column system circuit (not shown). The row address signals are latched by the address latch circuit 2b, and the latched address signal is supplied to the counter 2c as an access start address signals.

The counter 2c counts up the access start address signals in synchronization with read/write pulse signals (not shown) and generates the internal address signals A1 to A3 having the number of bits according to an address space.

Figure 3:
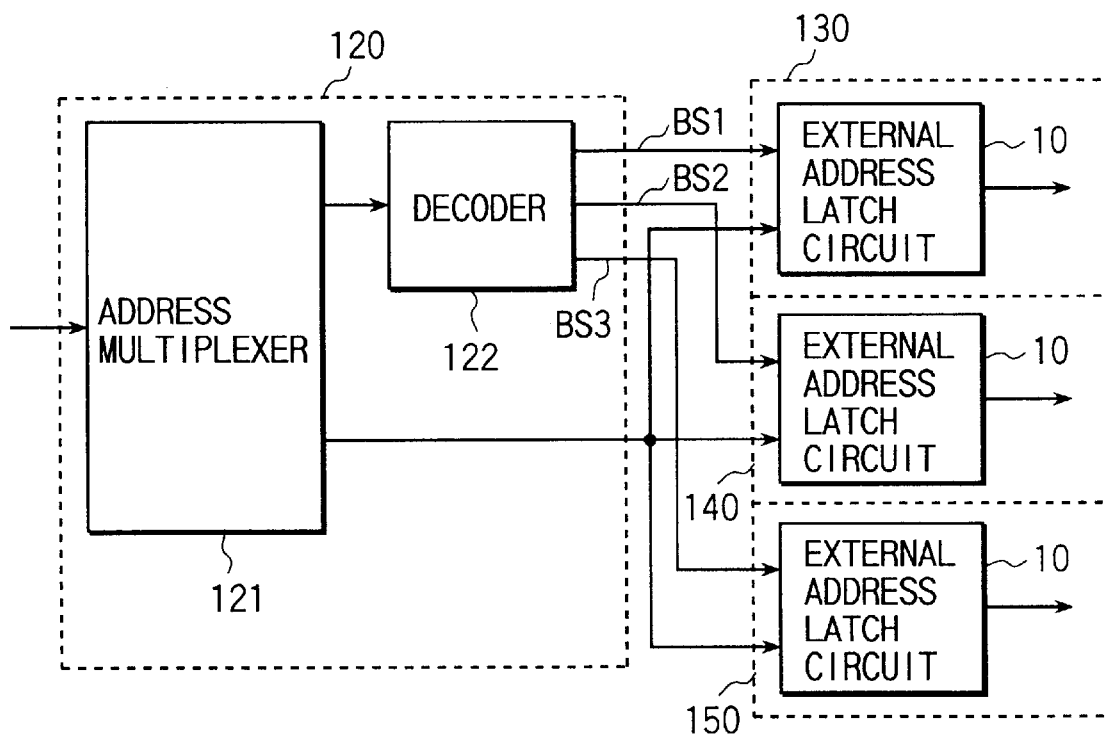
FIG. 3 is a block diagram showing an example of an external address signal generation circuit of the semiconductor memory illustrated in FIG. 1.

FIG. 3 illustrates a relationship between the external address generation circuit 120 and the external address latch circuit 10 of each of the address control blocks 130, 140 and 150. The circuit 120 includes an address multiplexer 121 and a decoder 122. The address multiplexer 121 is supplied with a plurality of address signals in sequence through the first selection circuit 110 in accordance with a toggle operation of a write enable signal (described later) in the redundant test mode. The address multiplexer 121 also sends the first-supplied address signal to the decoder 122. The decoder 122 decodes the address signal and outputs block select signals BS1 to BS3, respectively. These block select signals BS1 to BS3 are supplied to their corresponding external address latch circuits 10. The address multiplexer 121 supplies a subsequent address signal to a selected one of the external address latch circuits 10.

Figure 4:
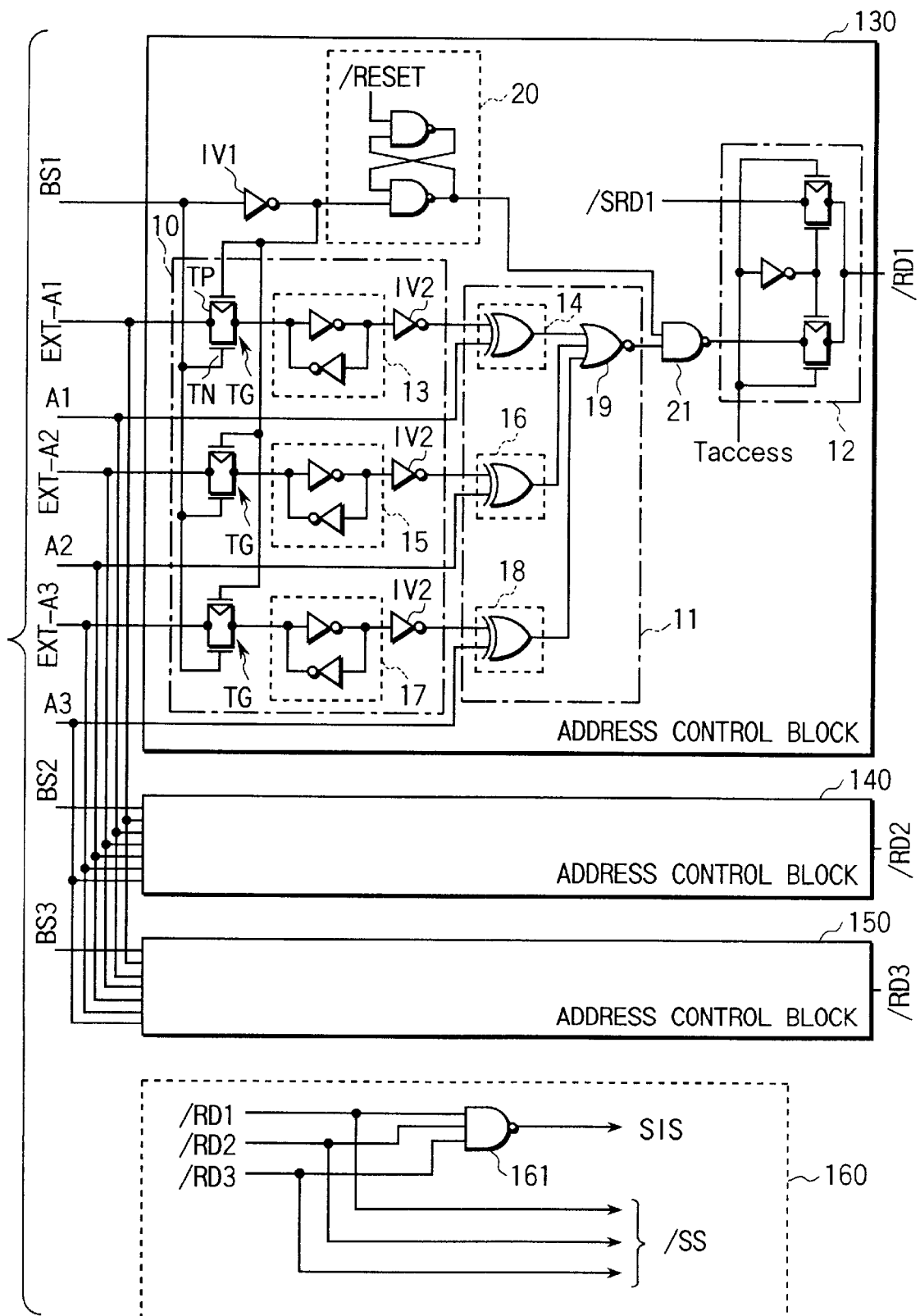
FIG. 4 is a circuit diagram showing an example of address control blocks of the semiconductor memory illustrated in FIG. 1.

FIG. 4 shows an example of the address control blocks 130, 140 and 150 and the logic circuit 160. Since these blocks have the same arrangement, only the circuit arrangement of the block 130 is illustrated in detail.

In the address control blocks 130, 140 and 150, bit signals of internal address signals are represented by A1, A2 and A3, those of external address signals are indicated by EXT-A1, EXT-A2 and EXT-A3, and those of block select signals are represented by BS1, BS2 and BS3. The block select signals BS1, BS2 and BS3 become high in level when their corresponding address control blocks 130, 140 and 150 are activated. In each of the blocks, the block select signal is inverted by an inverter circuit IV1 and then latched by a latch circuit 20.

The bit signals EXT-A1, EXT-A2 and EXT-A3 of the external address signals are each supplied to a corresponding of each of CMOS transfer gates TG in the external address latch circuit 10. The other ends of the CMOS transfer gates TG are connected to the input terminals of address bit latch circuits 13, 15 and 17, respectively.

In each of the blocks, the input signal of the inverter circuit IV1 is supplied to the gates of NMOS transistors TN of the CMOS transfer gates TG, and the output signal of the inverter circuit IV1 is supplied to those of POMS transistors TP of the CMOS transfer gates TG. Since, in an activated block, the input signal of the inverter circuit IV1 is at a high level and output signal of the inverter circuit IV1 is at a low level, the CMOS transfer gates TG are turned on. Consequently, the bit signals EXT-A1, EXT-A2 and EXT-A3 are latched by the address bit latch circuits 13, 15 and 17 through the CMOS transfer gates TG, respectively. The output signals of the address bit latch circuits 13, 15, and 17 are supplied to inverters IV2, respectively.

The output signals of the inverter circuits IV2 and the internal address signals A1, A2 and A3 are supplied to comparison circuits 14, 16 and 18 in the second address comparison circuit 11, respectively. These comparison circuits 14, 16 and 18 are constituted of, for example, exclusive-OR gates (EXOR). The circuits 14, 16 and 18 output a low-level signal when their comparison results coincide with each other and output a high-level signal when they do not coincide with each other. The output signals of the comparison circuits 14, 16 and 18 are supplied to a coincidence detection circuit 19 formed of, e.g., a NOR gate. The circuit 19 outputs a high-level signal when the three output signals of the comparison circuits 14, 16 and 18 are consistent with one another, and outputs a low-level signal when they are inconsistent with one another.

The output signal of the coincidence detection circuit 19 and that of the latch circuit 20 are supplied to a NAND gate 21. Since, in an activated block, the output signal of the latch circuit 20 is at a high level, the output level of the NAND gate 21 varies with the output signal (address comparison result) of the coincidence detection circuit 19. In contrast, in a deactivated block, the output signal of the latch circuit 20 is at a low level and thus the output level of the NAND gate 21 is fixed at a high level. The NAND gate 21 therefore inhibits the address comparison result from passing therethrough.

The output signal of the NAND gate 21 is supplied to one input terminal of the second selection circuit 12 whose selection is controlled by the redundant test mode signal Taccess. The other input terminal of the circuit 12 is supplied with a comparison output signal /SRDi (i=1, 2, 3) of the first address comparison circuit 6. As shown in FIG. 12, the first address comparison circuit 6 includes a plurality of address comparison circuits, and their output signals are supplied to the second selection circuits 12 of the address control blocks, respectively.

In each of the address control blocks 130, 140 and 150, the second selection circuit 12 selects an output signal /SRDi of the first address comparison circuit 6 (a result of comparison between the fuse data and internal address signals) or an output signal of the NAND gate 21 (a result of comparison between the external and internal address signals) in accordance with high and low levels of the redundant test mode signal Taccess, and outputs it as a redundant address select signal /RDi (i=1, 2, 3) of the address control block.

The logic circuit 160 has a NAND gate 161 supplied with signals /RD1, /RD2 and /RD3 output from the address control blocks 130, 140 and 150. The NAND gate 161 supplies a select inhibit signal SIS to the address decoder 3 when at least one of the output signals /RD1, /RD2 and /RD3 is activated. These output signals /RD1, /RD2 and /RD3 are supplied to their corresponding redundant address decoders 4a, 4b and 4c, and the activated output signals serve as select signals /SS of the redundant address decoders. Thus, when a select inhibit signal SIS is supplied to the address decoder 3, the select signal /SS is supplied to the redundant address decoder 4 to replace a defective block with a redundant block.

An operation of the semiconductor memory illustrated in FIGS. 1 to 4 will now be described.

Figure 5:
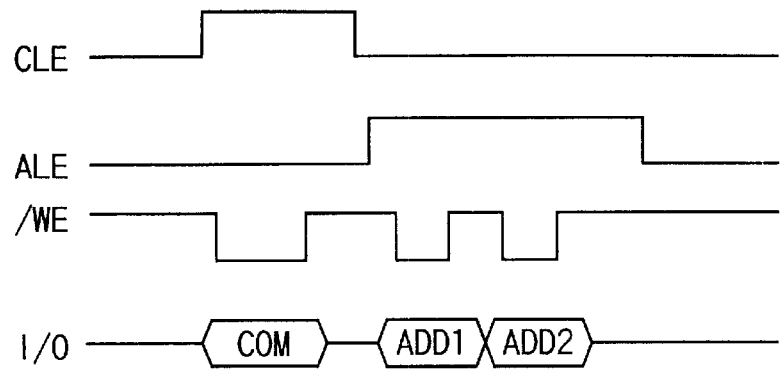
FIG. 5 is a timing chart for explaining an operation of the semiconductor memory of FIG. 1.

FIG. 5 shows an input sequence of command and address signals. When a command latch enable signal CLE is set at a high level and a write enable signal /WE is set at a low level, a command signal COM is supplied from an I/O pin. The command signal designates write, read, erase, and redundant test modes, and is decoded by a command decoder (not shown) provided in the controller 101. The command latch enable signal CLE is set at a low level, while an address latch enable signal ALE is set at a high level. In this state, the input buffer 1 receives first and second address signals ADD1 and ADD2 (address signals Add) from the I/O pin each time the write enable signal /WE is set at a low level. In the normal mode, for example, the first address signal ADD1 is a column address signal and the second address signal ADD2 is a row address signal. When the storage capacity of the memory cell array 7 is large, the row address signal is supplied to the input buffer 1 plural times. In the redundant test mode, for example, the first address signal ADD1 is an address signal for selecting an address control block and the second address signal ADD2 is an external address signal for testing. The number of first and second address signals ADD1 and ADD2 is equal to the number of address control blocks.

(1) First, an operation of the semiconductor memory set in the normal mode will be described.

When the memory cell array 7 is accessed in the normal mode, an address latch signal Tlatch for the redundant test mode is set at a low level. The address signal Add is thus supplied from the I/O pin to the internal address signal generation circuit 2 through the input buffer 1 and first selection circuit 110. In the circuit 2, the address multiplexer 2a, shown in FIG. 2, supplies the first-input address signal ADD1 to the column system circuit and the second-input address signal ADD2 is supplied to the counter 2c through the address latch circuit 2b. The counter 2c generates internal address signals A1 to A3 using the second address signal ADD2 as an access initial address.

The address decoder 3 decodes the internal address signals using its row decoder (not shown), and selects a word line WL corresponding to the address. The decoder 3 also decodes column internal address signals using its column decoder (not shown) and selects a bit line BL.

During this operation, the first address comparison circuit 6 compares the fuse data stored in the defective address storage circuit 5 and the internal address signals A1 to A3. When they coincide with each other, the circuit 6 outputs a comparison output signal /SRDi. The signal /SRDi is supplied to the second selection circuit 12 of each of the address control blocks 130, 140 and 150. Since at this time the redundant test mode signal Taccess is at a low level, the circuit 12 selects an output signal /SRDi of the first address comparison circuit 6 and outputs it as a redundant address select signal /RDi (i=1, 2, 3). The redundant address select signal /RDi is supplied to the logic circuit 160. In response to the signal /RDi, the logic circuit 160 sends a select inhibit signal SIS to the address decoder 3 and supplies a select signal /SS to its corresponding redundant address decoders 4a to 4c. A defective block (defective row or defective column) of the memory cell array 7 is therefore replaced with a redundant memory cell array.

(2) Then, an operation of the semiconductor memory set in the redundant test mode will be described.

When the memory cell array 7 is accessed in the redundant test mode, an address latch signal Tlatch for the redundant test mode is set at a high level, and an address signal is supplied from the I/O pin to the external address signal generation circuit 120 through the input buffer 1 and first selection circuit 110. The address multiplexer 121 of the circuit 120 supplies the first address signal ADD1 from the first selection circuit 110 to the decoder 122. The decoder 122 decodes the first address signal ADD1 and outputs a block select signal BS1 to select the external address latch circuit 10 of the address control block 130. After that, the address multiplexer 121 supplies the second address signal ADD2 from the first selection circuit 110 to the selected external address latch circuit 10 as external address signals EXT-A1 to EXT-A3.

The address multiplexer 121 then supplies the first address signal ADD1 from the first selection circuit 110 to the decoder 122. The decoder 122 decodes the signal ADD1 and outputs a block select signal BS2 to select the external address latch circuit 10 of the address control block 140. After that, the address multiplexer 121 supplies the second address signal ADD2 from the first selection circuit 110 to the selected external address latch circuit 10 as external address signals EXT-A1 to EXT-A3.

Similarly, a block select signal BS3 is generated to select the external address latch circuit 10 of the address control block 150, and external address signals EXT-A1 to EXT-A3 are supplied to the selected external address latch circuit 10.

The address latch signal Tlatch is then set at a low level and an access start address is input from outside. As described above, the access start address is set in the counter 2c of the internal address signal generation circuit 2 via the input buffer 1 and first selection circuit 110. The counter 2c counts up the addresses in synchronization with read and write pulses (not shown) to generate internal address signals A1 to A3 having the number of bits corresponding to an address space.

As described above, the address decoder 3 selects a word line WL in response to the internal address signals A1 to A3 and selects a bit line BL by the column system circuit (not shown).

During this operation, the second address comparison circuit 11 of each of the address control blocks 130, 140 and 150 compares the testing address signal latched in the external address latch circuit 10 and the internal address signals supplied from the internal address signal generation circuit 2. A comparison result is transmitted to the second selection circuit 12. Since at this time the redundant test mode signal Taccess is at a high level, the circuit 12 selects an output signal of the second address comparison circuit 11 and outputs it as a redundant address select signal /RDi (i=1, 2, 3). The signal /RDi is then supplied to the logic circuit 160. In response to the signal /RDi, the logic circuit 160 sends a select inhibit signal SIS to the address decoder 3 and supplies a select signal /SS to its corresponding redundant address decoders 4a to 4c. A block (row or column) of the memory cell array 7 is therefore replaced with a redundant memory cell array in response to the testing address signal.

As described above, in the redundant test mode, a desired testing address signal can be input and latched in the external address latch circuit 10; therefore, an address for testing can freely be set.

According to the first embodiment described above, the semiconductor memory comprises a redundant memory test circuit 100, and this circuit 100 has a redundant test mode in which a testing address signal can be input from outside. In this mode, an external address signal can be latched in the external address latch circuit 10 of each of the address control blocks 130, 140 and 150. For this reason, the testing address signal can be set from outside, irrespective of a fuse element or a nonvolatile memory cell for storing a defective address; therefore, part of the memory cell array can easily be replaced with the redundant memory cell array. Consequently, at an early stage of development of semiconductor memories, a sample free of an intrinsic defect can easily be achieved and evaluated and a test of devices can be carried out with reliability.

If, furthermore, an external address signal is changed in the redundant test mode, the above replacement can be performed many times. Even after at least part of a fuse of the defective address storage circuit 5 is blown, fuse data can be ignored unless the second selection circuit 12 selects an output signal of the first address comparison circuit 6. The memory cell array can thus be measured before the fuse is blown. Consequently, the cause of defects can easily be checked in such an operation mode as to access a defective cell replaced with a redundant cell. For example, in an all-erase mode and an all-write mode in an EEPROM, a defective cell replaced with a redundant cell will be accessed. In the redundant test mode of the present invention, however, the cause of a phenomenon due to a defective cell which has not yet been replaced, such as a decrease in write/erase voltage in the EEPROM, can easily be detected.

In the redundant test mode, after the setting of external address signals is completed, the redundant test mode address latch signal Tlatch is set at a low level (normal operation mode), and the redundant test mode signal Taccess is set at a high level (redundant test mode). If another operation (an erase, write or read operation in the case of an EEPROM) is then performed, whether to replace a defective cell with a redundant cell depends upon a comparison result of the second address comparison circuit 11. This replacement can thus be controlled by the external address signal set in the external address latch circuit 10.

Figures 6A, 6B:
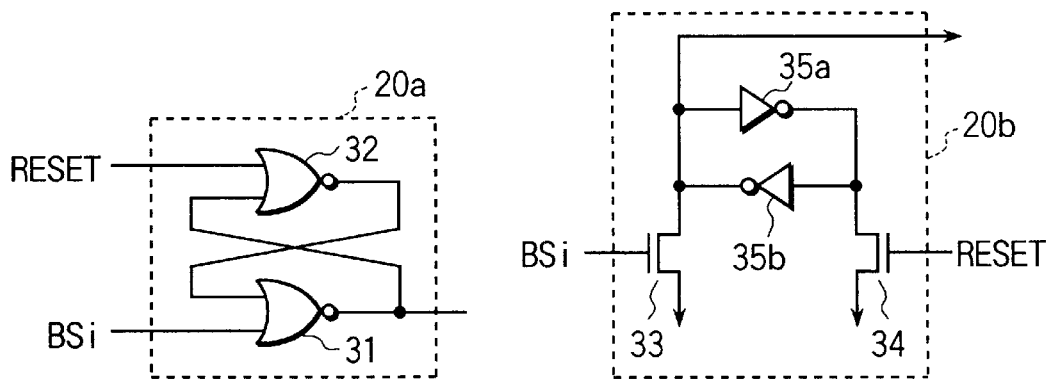
FIGS. 6A and 6B are circuit diagrams illustrating modifications of a latch circuit in the address control block shown in FIG. 4.

FIGS. 6A and 6B illustrate latch circuits 20a and 20b as modifications of the latch circuit 20 of FIG. 4.

In the latch circuit 20a shown in FIG. 6A, a block select signal BSi is supplied to one input node of a NOR gate 31, and a reset signal Reset is supplied to one input node of a NOR gate 32. A signal is output from an output node of the NOR gate 31.

The latch circuit 20b shown in FIG. 6B includes NMOS transistors 33 and 34, and inverters 35a and 35b. A block select signal BSi is supplied to a gate of the NMOS transistor 33, and a reset signal Reset is supplied to a gate of the NMOS transistor 34. The inverters 35a and 35b are connected between a drain of the NMOS transistors 33 and 34. A signal is output from the drain of the NMOS transistor 33.

The latch circuits 20a and 20b can be reset in response to an externally-supplied reset signal. If, therefore, a reset signal is input before an address is input, an address control block can be selected when the need arises.

According to the foregoing first embodiment, a specific address protect mode for inhibiting a specific address of the memory cell array 7 from being selected can be achieved by increasing the number of latch circuits for latching an external address signal. By applying this, a read inhibit operation (protect) in a specific address of the memory cell array 7 can be achieved by latching an external address signal corresponding to the specific address in the latch circuit.

A second embodiment of the present invention capable of the above specific address protect mode will now be described.

Figure 7:
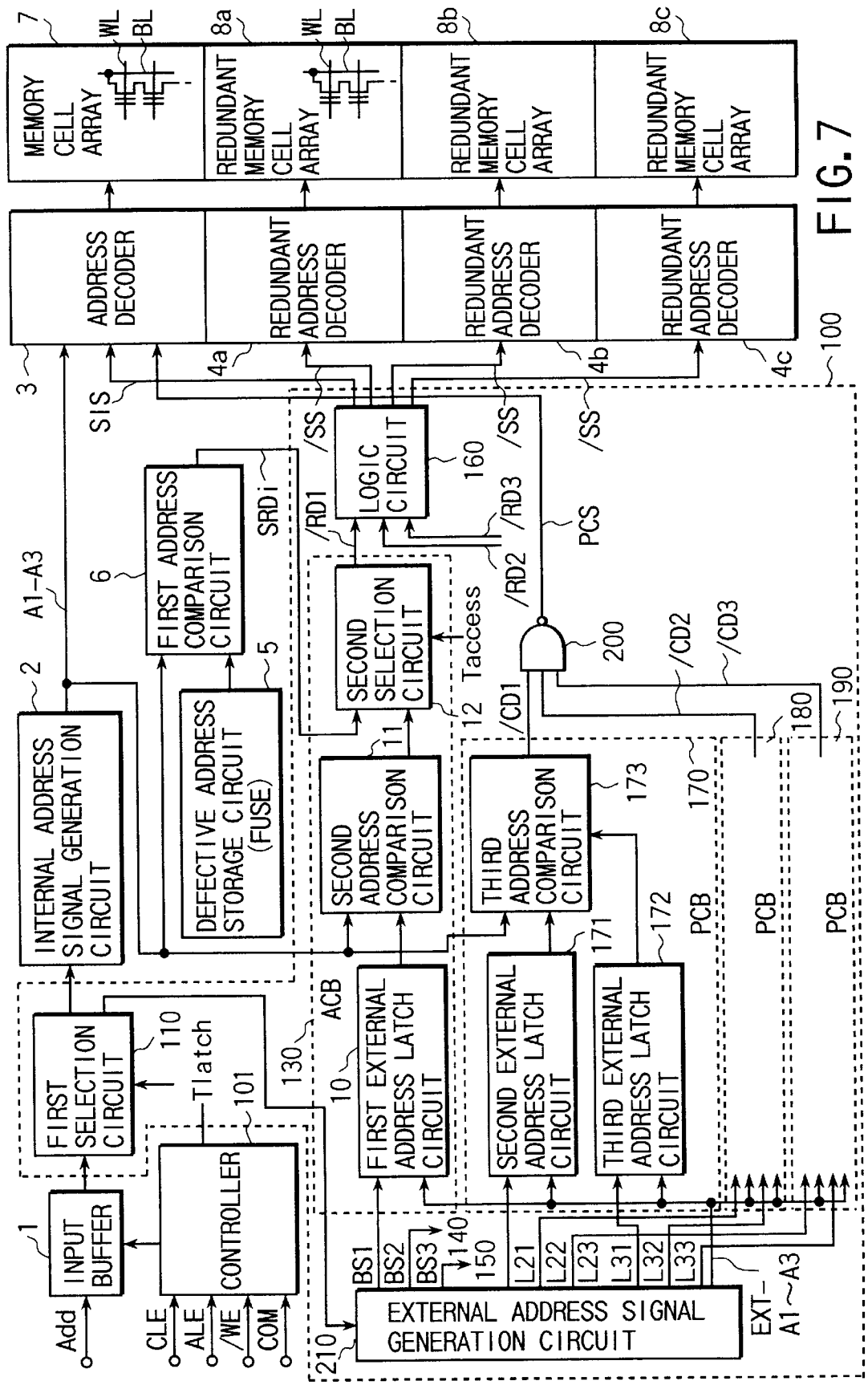
FIG. 7 is a block diagram illustrating a semiconductor memory according to a second embodiment of the present invention.

FIG. 7 schematically shows a semiconductor memory according to the second embodiment of the present invention.

In the second embodiment, protect control blocks (PCB) 170, 180 and 190 and a NAND circuit 200 are added to the semiconductor memory illustrated in FIG. 1, and an external address signal generation circuit 210 other than the circuit 120 of the first embodiment is provided. In the second embodiment, the description of address control blocks 140 and 150 are deleted for the sake of convenience. The external address latch circuit 10 of the address control block 130 in FIG. 1 is shown as a first external address latch circuit 10 thereof in FIG. 7.

Like the external address signal generation circuit 120, the external address signal generation circuit 210 outputs block select signals BS1, BS2 and BS3 for selecting the address control blocks 130, 140 and 150 and external address signals EXT-A1, EXT-A2 and EXT-A3. The circuit 210 also outputs signals for controlling the protect control blocks 170, 180 and 190.

Each of the protect control blocks includes a second external address latch circuit 171, a third external address latch circuit 172 and a third address comparison circuit 173. The second and third external address latch circuits 171 and 172 each latch an externally-input address signal in the protect mode. The second external address latch circuit 171 latches an external address signal for designating a specific address of the memory cell array 7 to inhibit data from being read out of the address (protect data of the address). The third address comparison circuit 173 compares an internal address signal generated from the internal address signal generation circuit 2 with the address signal latched in the second external address latch circuit 171. The third external address latch circuit 172 stores data for inhibiting the comparison circuit 173 from comparing part of the data latched in the circuit 171.

Basically the third address comparison circuit 173 compares the address signal latched in the second external address latch circuit 171 and the internal address signal supplied from the internal address signal generation circuit 2. When those signals coincide with each other, the circuit 173 outputs a select inhibit signal for setting a specific address of the memory cell array 7, which corresponds to an address to be compared, in a nonselective state.

The third address comparison circuit 173 is then controlled in response to the address signal latched in the third external address latch circuit 172. The specific address of the memory cell array 7 can thus be set in a nonselective state in response to the address signal latched in the third external address latch circuit 172.

Figure 8:
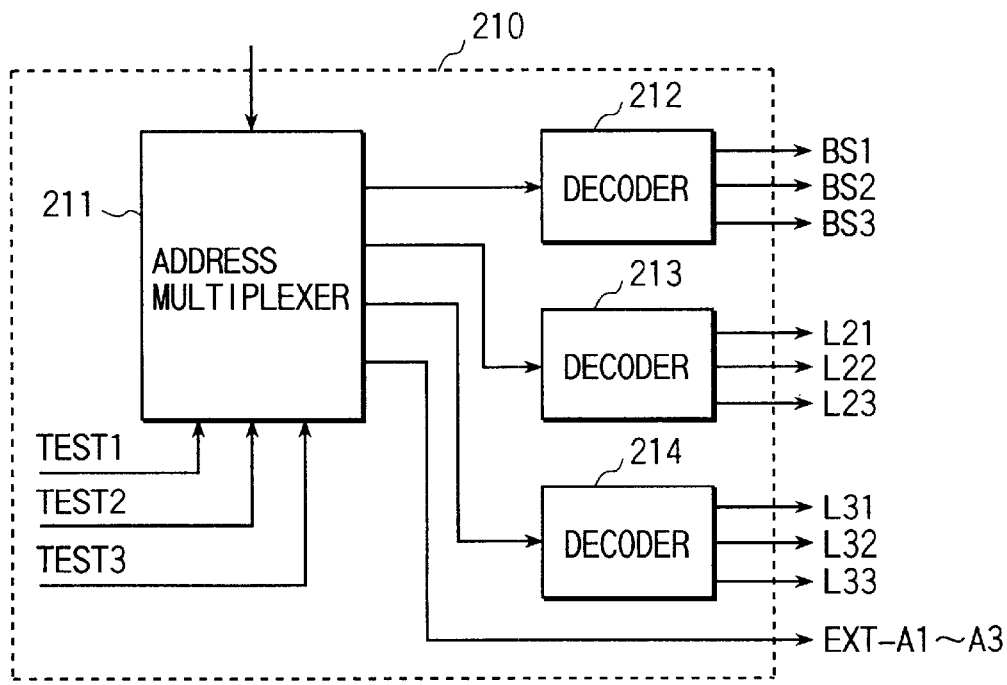
FIG. 8 is a block diagram showing an example of an external address signal generation circuit of the semiconductor memory illustrated in FIG. 7.

FIG. 8 shows an example of an arrangement of the external address signal generation circuit 210. This circuit includes an address multiplexer 211 and decoders 212 to 214. The address multiplexer 211 is supplied with an address signal from a first selection circuit 110 and selection signals TEST1 to TEST3. In response to the selection signals TEST1 to TEST3, the multiplexer 211 supplies an output signal of the circuit 110 to one of the decoders 212 to 214. When the selection signal TEST1 is activated, an address signal is supplied from the circuit 110 to the decoder 212. When the selection signal TEST2 is activated, the address signal is supplied to the decoder 213. When the selection signal TEST3 is activated, the address signal is supplied to the decoder 214. Like the address multiplexer 121 shown in FIG. 3, the multiplexer 211 outputs address signals of the first selection circuit 110 as external address signals EXT-A1 to EXT-A3. These signals EXT-A1 to EXT-A3 are supplied to the address control blocks 130, 140 and 150 and the protect control blocks 170, 180 and 190.

Like the decoder 122 illustrated in FIG. 3, the decoder 212 decodes an address supplied from the address multiplexer 211 and generates block select signals BS1 to BS3 for selecting the address control blocks. The decoder 213 decodes an address signal supplied from the address multiplexer 211 and outputs select signals L21 to L23 for selecting one of the second external address latch circuits of the protect control blocks 170, 180 and 190. The decoder 214 decodes an address signal supplied from the address multiplexer 211 and outputs select signals L31 to L33 for selecting one of the third external address latch circuits of the protect control blocks.

Figure 9:
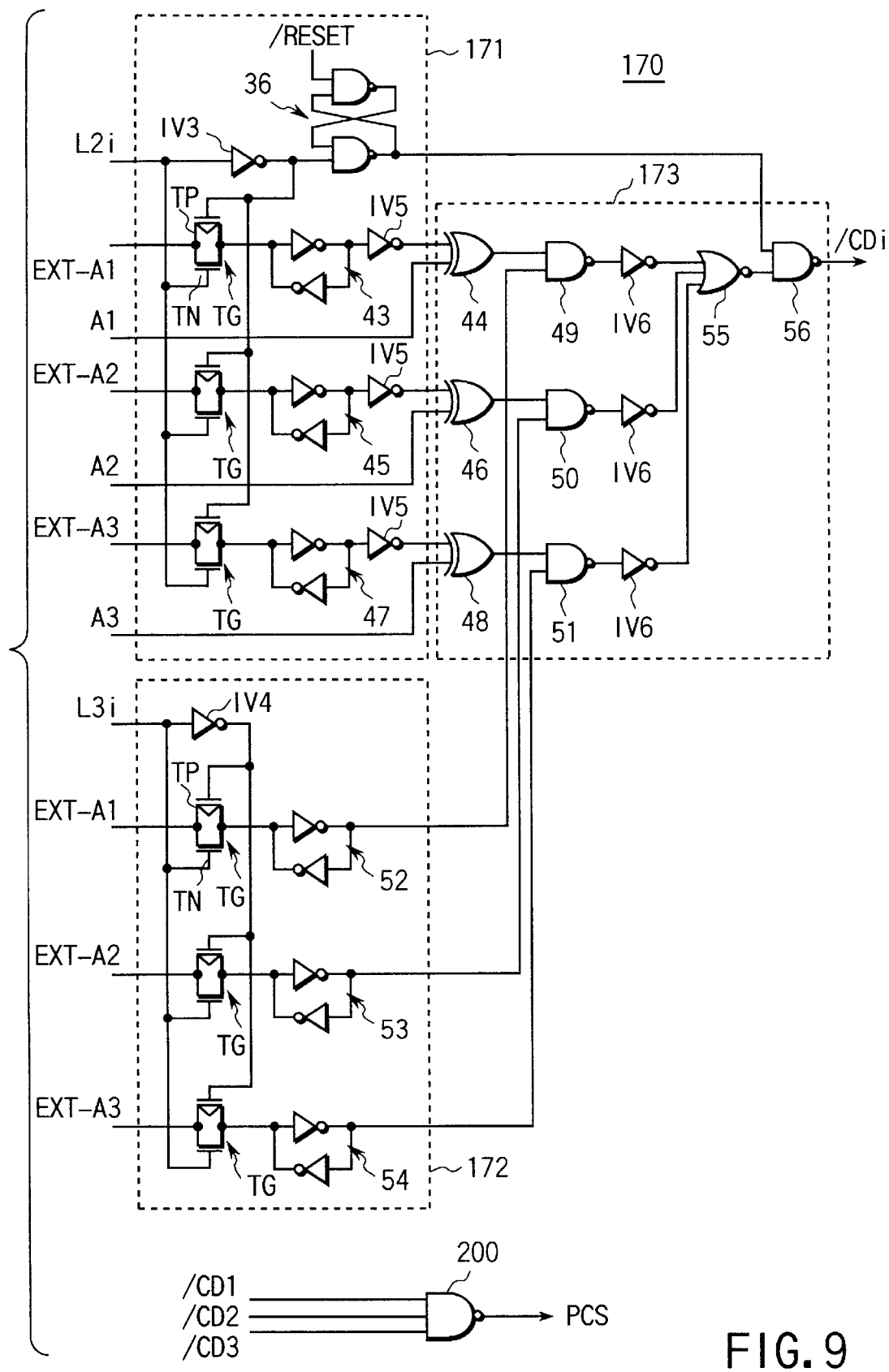
FIG. 9 is a circuit diagram showing a main part of the semiconductor memory of FIG. 7

FIG. 9 illustrates an example of each of the second address latch circuit 171, third external address latch circuit 172, and third address comparison circuit 173 in FIG. 7.

In the circuit arrangement illustrated in FIG. 9, the bit signals of internal address signals are represented by A1, A2 and A3 and those of external address signals are represented by EXT-A1, EXT-A2 and EXT-A3, assuming that an 8-bit address space is employed. The select signal supplied to the second external address latch circuit 171 of each of the protect control blocks is represented by L2i (i=1, 2, 3), while the select signal supplied to the third external address latch circuit 172 is represented by L3i (i=1, 2, 3).

The select signal L2i is activated at a high level when an external address signal is supplied in an activated protect operation. In the second external address latch circuit 171, the select signal L2i is inverted by an inverter circuit IV3 and then latched in a latch circuit 36. The input signal of the inverter circuit IV3 is supplied to the gates of NMOS transistors TN each including a CMOS transfer gate TG, and the output signal of the inverter circuit IV3 is supplied to the gates of PMOS transistors TP each including the CMOS transfer gate TG. The bit signals EXT-A1, EXT-A2 and EXT-A3 of the external address signals are each supplied to one end of its corresponding CMOS transfer gate TG. The other ends of the CMOS transfer gates TG are connected to input terminals of latch circuits 43, 45 and 47, respectively. If, therefore, the select signal L2i is activated, the bit signals EXT-A1, EXT-A2 and EXT-A3 are latched in the latch circuits 43, 45 and 47 through the CMOS transfer gates TG respectively. The output signals of the latch circuits 43, 45 and 47 are supplied to inverters IV5, respectively.

The select signal L3i is activated at a high level when an external address signal is supplied in an activated protect operation. In the third external address latch circuit 172, the select signal L3i is inverted by an inverter circuit IV4. The input signal of the inverter circuit IV4 is supplied to the gates of NMOS transistors TN each including a CMOS transfer gate TG, and the output signal of the inverter circuit IV4 is supplied to the gates of PMOS transistors TP each including the CMOS transfer gate TG. The bit signals EXT-A1, EXT-A2 and EXT-A3 of the external address signals are each supplied to one end of a corresponding CMOS transfer gate TG. The other ends of the CMOS transfer gates TG are connected to input terminals of latch circuits 52, 53 and 54, respectively. If, therefore, the select signal L3i is activated, the bit signals EXT-A1, EXT-A2 and EXT-A3 are latched in the latch circuits 52, 53 and 54 through the CMOS transfer gates TG, respectively.

The output signals of the inverter circuits IV5 and the bits A1, A2 and A3 of the internal address signals are supplied to their respective comparison circuits 44, 46 and 48 constituting the third address comparison circuit 173. These comparison circuits 44, 46 and 48 are each constituted by, e.g., an exclusiveOR gate (EXOR). The comparison circuits output a low-level signal when their comparison results coincide with each other and output a high-level signal when they do not coincide. The output signals of the comparison circuits are each supplied to a corresponding input node of NAND gates 49, 50 and 51. The output signals of the latch circuits 52, 53 and 54 of the third external address latch circuit 172 are supplied to the other input nodes of the NAND gates 49, 50 an 51, respectively. The output signals of the NAND gates are inverted by an inverter circuit IV6 and then supplied to a coincidence detection circuit 55 formed of, e.g., a NOR gate (NAND gate of low logic). The circuit 55 outputs a high-level signal when logical operations of three input signals are consistent and a low-level signal when they are inconsistent. The output signal of the circuit 55 is sent to a NAND gate 56 together with an output signal of the latch circuit 36. Thus, when a specific address protect operation is activated (when the output signal of the latch circuit 36 is at a high level), the output signal (/CDi, i=1, 2, 3) of the NAND gate 56 varies in level with that (address comparison result) of the coincidence detection circuit 55 and, in other words, the NAND gate 56 causes the address comparison result to pass therethrough.

In contrast, when the specific address protect operation is deactivated (when the output signal of the latch circuit 36 is at a low level), the output signal /CDi of the NAND gate 56 is fixed at a high level and, in other words, the NAND gate 56 inhibits the address comparison result from passing therethrough.

The output signals /CDi (i=1, 2, 3) of the protect control blocks 170, 180 and 190 are supplied to a NAND gate 200. A protect control signal PCS output from the NAND gate 200 is supplied to the address decoder 3. The address decoder 3 inhibits data from being read out of a specific address in response to the protect control signal PCS and, in other words, data of the specific address of the memory cell array is protected.

An operation of the semiconductor memory shown in FIGS. 7 to 9 will now be described.

Since the operations of the memory, which are performed when the memory cell array 7 is accessed in the normal and redundant test modes, are the same as those described above with reference to FIGS. 1 to 5, their descriptions are omitted. In the external address signal generation circuit 210, the decoder 212 generates block select signals BS1 to BS3 by activating the selection signal TEST1 in the redundant test mode. As has been described in the first embodiment, an address signal is input in accordance with a toggle operation of a write enable signal /WE.

When the memory cell array is accessed in a specific address protect mode and a specific address bit protect mode, an address latch signal Tlatch is set at a high level, and an address signal is supplied from the I/O pin to the external address signal generation circuit 210 through the input buffer 1 and first selection circuit 110. At this time, the selection signal TEST2 is activated and the address multiplexer 211 supplies an address signal to the decoder 213. The decoder 213 decodes the address signal to activate the select signal L21. In response to the select signal L21, the second external address latch circuit 171 of the protect control block 170 is selected. Under this condition, the address signals supplied to the address multiplexer 211 from the I/O pin through the above path, are supplied to the second external address latch circuit 171 as the external address signals EXT-A1 to EXT-A3.

After that, an address signal supplied to the address multiplexer 211 from the I/O pin, is supplied to the decoder 213 to activate the select signal L22. Thus, the second external address latch circuit 171 of the protect control block 180 is selected in response to the select signal L22. In this state, the address signals supplied to the address multiplexer 211 from the I/O pin, are supplied to the circuit 171 as external address signals EXT-A1 to EXT-A3.

Similarly, the second external address latch circuit 171 of the protect control block 190 is selected and the external address signals EXT-A1 to EXT-A3 are latched in the circuit 171.

When the selection signal TEST3 is activated, the address multiplexer 211 supplies an address signal to the decoder 214. The decoder 214 decodes the address signal to activate the select signal L31. In response to the select signal L31, the third external address latch circuit 172 of the protect control block 170 is selected. Under this condition, the address signals supplied to the address multiplexer 211 from the I/O pin through the above path, are supplied to the third external address latch circuit 172 as external address signals EXT-A1 to EXT-A3.

After that, an address signal supplied to the address multiplexer 211 from the I/O pin, is supplied to the decoder 214 to activate the select signal L32. The third external address latch circuit 172 of the protect control block 180 is therefore selected in response to the select signal L32. In this state, the address signals supplied to the address multiplexer 211 from the I/O pin, are supplied to the circuit 172 as external address signals EXT-A1 to EXT-A3.

Similarly, the third external address latch circuit 172 of the protect control block 190 is selected and the external address signals EXT-A1 to EXT-A3 are latched in the circuit 172.

As described above, the external address signals for protecting a specific address of the memory cell array 7 are latched in the second and third external address latch circuits 171 and 172 of the protect control blocks 170, 180 and 190.

The contents of the external address signals latched in the circuits 171 and 172 can be set freely in accordance with a protect region of the memory cell array 7.

After that, the address latch signal Tlatch is set at a low level. If, in this state, an access start address is supplied to the I/O pin, it is set in the counter 2c (shown in FIG. 2) of the internal address signal generation circuit 2 through the input buffer 1 and first selection circuit 110. The counter 2c counts up in synchronization with read and write pulse signals (not shown) to generate internal address signals A1 to A3 having the number of bits corresponding to an address space. The address decoder 3 decodes the internal address signals A1 to A3 and selects a word line corresponding to an address. Similarly, a bit line is selected BL by the column system circuit (not shown).

During this operation, the third address comparison circuit 173 compares the address signals latched in the second external address latch circuit 171 and the internal address signals supplied from the internal address signal generation circuit 2.

The comparison result is controlled in response to the address signals latched in the third external address latch circuit 172. More specifically, when the level of bits of address signals latched in the circuit 172 is low, the comparison results of comparison circuits 44, 46 and 48 which correspond to the low-level bits are masked. The output signals /CDi (i=1, 2, 3) of the third address comparison circuit 173 are therefore activated. The output signals /CDi are supplied to the NAND gate 200, and a protect control signal PCS is output from the gate 200 and supplied to the address decoder 3, thereby inhibiting access to data of a specific address of the memory cell array 7 corresponding to a specific address.

The above operation of the semiconductor memory will be described more specifically. Assume that bit signals EXT-A1 and EXT-A2 of external address signals are at a high level and bit signal EXT-A3 thereof is at a low level.

The output signal of the address bit latch circuit 54, which corresponds to the bit signal EXT-A3 in the third external address latch circuit 172, becomes high in level. If, therefore, the bit signal EXT-A3 coincides with an internal address bit A3 and the output signal of the comparison circuit 48 is set at a low level, the output signal of the NAND gate 51 becomes high in level; accordingly, the output signal of the inverter circuit IV6 connected to the NAND gate 51 becomes low in level.

Since, however, the output signals of the address bit latch circuits 52 and 53 corresponding to the bit signals EXT-A1 and EXT-A2 in the third external address latch circuit 172 are at a low level, the output signals of the NAND gates 49 and 50 are at a high level, while those of the inverter circuits IV6 provided on the output sides of the NAND gates 49 and 50 are at a low level. These conditions are determined, irrespective of high and low levels of the internal address bits A1 and A2. Therefore, the output signal of the NOR gate 55 supplied with the output signals of the three inverter circuits IV6 becomes high in level. Since the output signal of the latch circuit 36 is then set at a high level, the output signal /CDi of the NAND gate 56 becomes low in level. For this reason, the memory cell array 7 is inhibited from being accessed irrespective of the levels of bits A1 and A2 of the internal address signals. As a result, when the bit A3 coincides with the bit signal EXT-A3, its corresponding addresses are all set in a nonselective state.

If all bit signals EXT-A1 to EXT-A3 of the external address signals are set at a high level by designating the above protect mode, the levels of three input nodes of the NOR gate 55 all become low and thus the output signal of the NOR gate 55 is set at a high level. If the output signal of the latch circuit 36 is at a high level, the output signal /CDi of the NAND gate 56 becomes low in level. All the addresses of the memory cell array 7 are set in a nonselective state irrespective of bits A1 to A3 of the internal address signals. The data of the memory cell array 7 can thus be protected properly by arbitrarily setting the external address signals by software.

According to the second embodiment described above, the external address signals can be latched in the second and third external address latch circuits 171 and 172 of the protect control blocks 170, 180 and 190 to protect a desired region of the memory cell array 7. The memory cell array 7 can thus be protected in various modes by setting the external address signals as appropriate.

Figure 10:
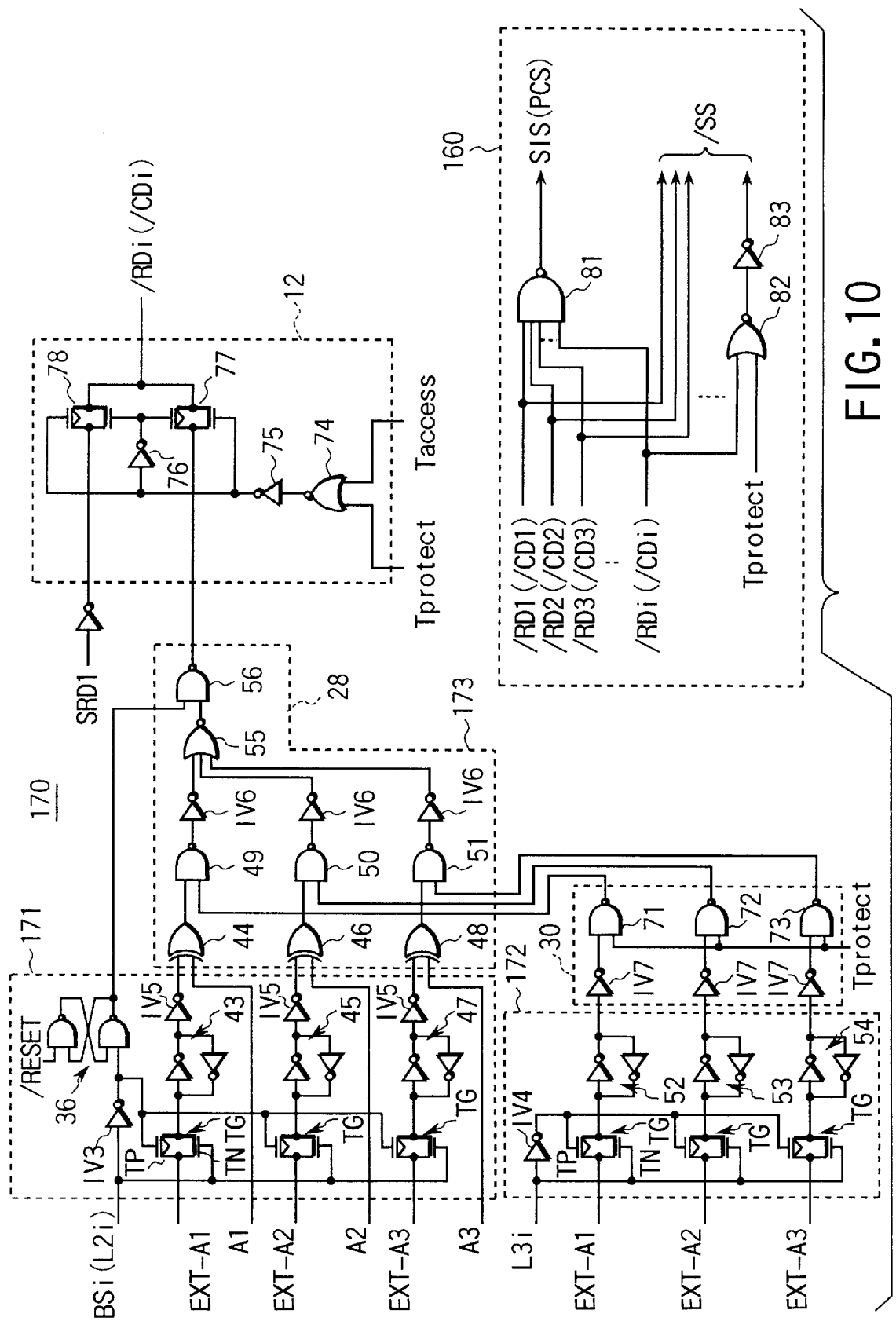
FIG. 10 is a circuit diagram illustrating a modification of the semiconductor memory according to the second embodiment of the present invention.
Figure 11:
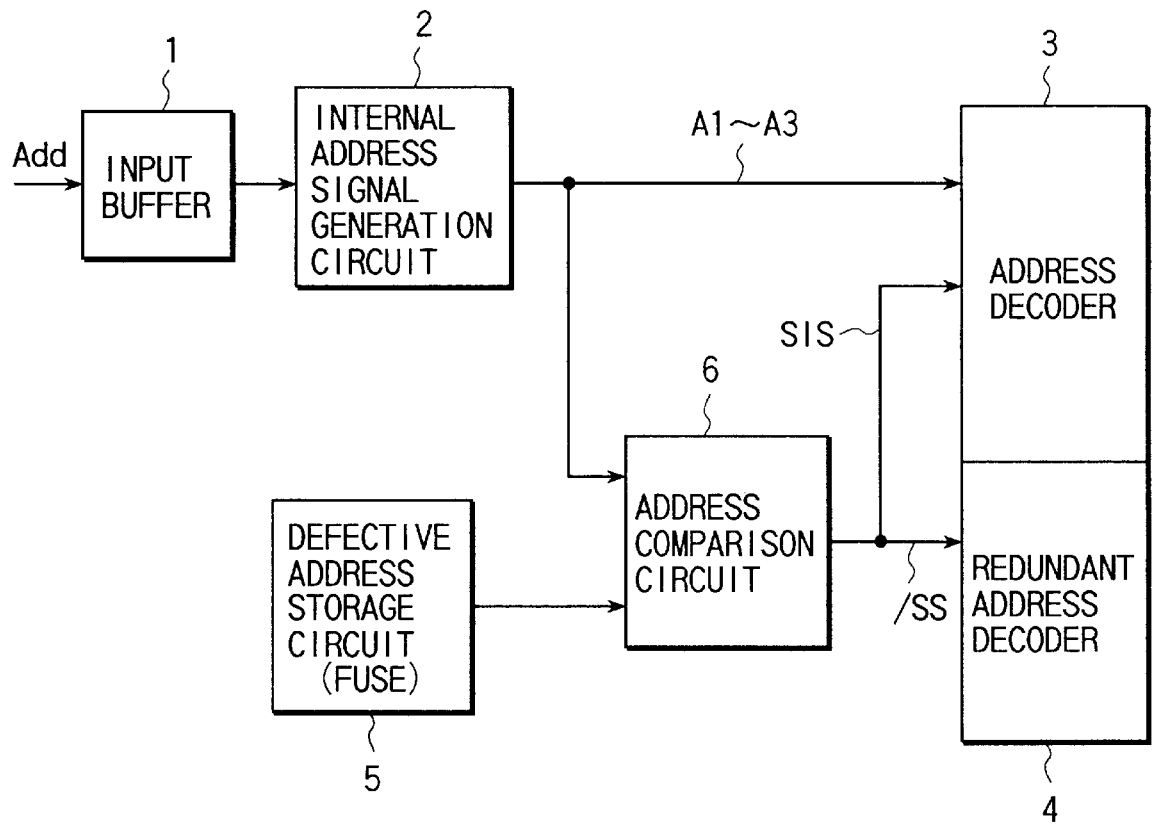
FIG. 11 is a block diagram illustrating an example of arrangement of an address control circuit including a redundant control circuit in a prior art semiconductor memory.

FIG. 10 illustrates a modification of the semiconductor memory according to the second embodiment of the present invention. This modification has both the functions of the first and second embodiments shown in FIGS. 4 and 9, i.e., the redundant test function of the first embodiment and the protect function of the second embodiment which are switched to each other in response to a mode signal Tprotect. The second and third address latch circuits 171 and 172 and third address comparison circuit 173 are identical with those shown in FIG. 9. However, the circuit of FIG. 10 differs from that of FIG. 9 in that a selection circuit 30 is added to switch between the redundant test function and protect function and in that the internal constitutions of the second selection circuit 12 and logic circuit 160 are changed.

In the selection circuit 30, three inverter circuits IV7 are connected respectively to the nodes of the latch circuits 52 to 54 of the third external address latch circuit 172. The output signals of the inverter circuits IV7 and the mode signal Tprotect are supplied to the input nodes of the NAND gates 71 to 73. The output signals of these NAND gates are supplied to corresponding NAND gates 49 to 51 of the third address comparison circuit 173.

The second selection circuit 12 includes a NOR gate 74 supplied with a mode signal Tprotect and a redundant test mode signal Taccess, an inverter circuit 75 for inverting an output signal of the NOR gate 74, another inverter circuit 76 for inverting an output signal of the inverter circuit 75, and CMOS transfer gates 77 and 78. The CMOS transfer gate 77 is constituted of P-channel and N-channel MOS transistors. The output signal of the inverter circuit 76 is supplied to the gate of the P-channel MOS transistor, the output signal of the inverter circuit 75 is supplied to the gate of the N-channel MOS transistor, and the output signal of the NAND gate 56 is supplied to the input node of the CMOS transfer gate 77. The CMOS transfer gate 78 is constituted of P-channel and N-channel MOS transistors. The output signal of the inverter circuit 75. is supplied to the gate of the P-channel MOS transistor, the output signal of the inverter circuit 76 is supplied to the gate of the N-channel MOS transistor, and the comparison output signal /SRDi is supplied to the input node of the CMOS transfer gate 78. The output nodes of the CMOS transfer gates 77 and 78 are connected to each other, and a signal /RDi(/CDi) is output from the output nodes.

The logic circuit 160 includes a NAND gate 81 supplied with signals /RD1 to /RDi (/CD1 to /CDi), a NOR gate 82 supplied with signals /RDi (/CDi) and protect mode signal Tprotect, and an inverter circuit 83 connected to the output node of the NOR gate 82.

In FIG. 10, the selection circuit 30 determines whether an address signal of the third external address latch circuit 172 can be controlled in response to the protect mode signal Tprotect, and the second selection circuit 12 selects an output of address comparison result even in the protect mode. By the logic circuit 160, none of the redundant blocks are selected in response to the protect mode signal Tprotect. In other words, the memory cell array 7 and redundant memory cell arrays 4a to 4c can be protected, with the result that the above modification can perform the same operation as that of the second embodiment.

In the second embodiment, a circuit arrangement for the protect mode is used in addition to the arrangement for the redundant test mode. In order to perform the operation only in the protect mode, the arrangement for the redundant test mode can be deleted.

According to the circuit arrangement shown in FIG. 10, the functions of both the first and second external address latch circuits 10 and 171 can be fulfilled by one external address latch circuit, the output node of the one external address latch circuit is selectively connected to the second and third address comparison circuits 11 and 173 in accordance with the redundant test mode and protect mode. Since, therefore, the number of external address latch circuits can be reduced, the area of a chip can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array having a plurality of memory cells;
   a redundant memory cell array configured to replace a part of the memory cell array, the redundant memory cell array having a plurality of memory cells;
   an internal address signal generation circuit for generating an internal address signal for accessing the memory cell array, in response to an address signal supplied from outside;
   a defective address storage circuit for storing a defective address signal for replacing the part of the memory cell array;
   a first address comparison circuit for comparing the internal address signal generated from the internal address signal generation circuit and the defective address signal stored in the defective address storage circuit; and
   a redundant memory test circuit for testing the redundant memory cell array, the redundant memory test circuit holding an address signal of the memory cell array, and setting the memory cell array in a nonselective state and setting the redundant memory cell array in a selective state when the address signal held in the redundant memory test circuit and the internal address signal generated from the internal address signal generation circuit coincide with each other.

2. A semiconductor memory device according to claim 1, wherein the redundant memory test circuit comprises:
   a latch circuit for latching the address signal supplied from outside, in a redundant test mode;
   a second address comparison circuit for comparing the address signal latched in the latch circuit and the internal address signal generated from the internal address signal generation circuit, the second address comparison circuit outputting a coincidence signal when the address signal and the internal address signal coincide with each other; and
   a logic circuit for setting the memory cell array in the nonselective state and setting the redundant memory cell array in the selective state in response to the coincidence signal output from the second address comparison circuit.

3. A semiconductor memory device according to claim 2, further comprising:
   a selection circuit for receiving an address signal from outside, and supplying the address signal to the internal address signal generation circuit when the memory cell array is accessed and supplying the address signal to the latch circuit in the redundant test mode.

4. A semiconductor memory device according to claim 3, wherein the internal address signal generation circuit includes a counter for counting up the address signal supplied from the selection circuit and generating the internal address signal.

5. A semiconductor memory device comprising:
   a memory cell array having a plurality of memory cells;
   a plurality of redundant memory cell arrays configured to replace a part of the memory cell array, each of the plurality of redundant memory cell arrays having a plurality of memory cells;
   an internal address signal generation circuit for generating an internal address signal for accessing the memory cell array, in response to an address signal supplied from outside;

a defective address storage circuit for storing a defective address signal for replacing the part of the memory cell array;

a first address comparison circuit for comparing the internal address signal generated from the internal address signal generation circuit and the defective address signal stored in the defective address storage circuit; and a redundant memory test circuit for testing the plurality of redundant memory cell arrays, the redundant memory test circuit having a plurality of address control blocks, each of the plurality of address control blocks including:

a latch circuit for latching an address signal of the memory cell array;

a second address comparison circuit for comparing the address signal latched in the latch circuit and the internal address signal generated from the internal address signal generation circuit, the second address comparison circuit outputting a coincidence signal when the address signal and the internal address signal coincide with each other; and a logic circuit for setting the memory cell array in a nonselective state and setting the plurality of redundant memory cell arrays in a selective state in response to the coincidence signal output from the second address comparison circuit.

6. A semiconductor memory device according to claim 5, further comprising:

a selection circuit for receiving an external address signal from outside and supplying the external address signal to the internal address signal generation circuit when the memory cell array is accessed.

7. A semiconductor memory device according to claim 6, further comprising:

a multiplexer connected to the selection circuit, the multiplexer sorting external address signals supplied from the selection circuit, in a redundant test mode; and a decoder connected to the multiplexer, the decoder selecting the latch circuit of one of the plurality of address control blocks in response to a first external address signal supplied from the multiplexer, wherein the latch circuit selected by the decoder latches a second external address signal supplied from the multiplexer.

8. A semiconductor memory device according to claim 6, wherein the internal address signal generation circuit includes a counter for counting up the address signal supplied from the selection circuit and generating the internal address signal.

9. A semiconductor memory device comprising:

a memory cell array having a plurality of memory cells;

an internal address signal generation circuit for generating an internal address signal for accessing the memory cell array; and a protect circuit for protecting the memory cell array, the protect circuit holding an address signal of an arbitrary region of the memory cell array, and inhibiting access to at least part of the memory cell array when the address signal held in the protect circuit and the internal address signal generated from the internal address signal generation circuit coincide with each other.

10. A semiconductor memory device according to claim 9, wherein the protect circuit comprises:

a first external address latch circuit for latching a first protective address signal supplied from outside;

a second external address latch circuit for latching a second protective address signal supplied from outside; and a comparison circuit for comparing the first protective address signal latched in the first external address latch circuit and the internal address signal generated from the internal address signal generation circuit, the comparison circuit controlling a result of comparison between the first protective address signal and the internal address signal in response to the second protective address signal and setting at least part of the memory cell array in a nonselective state.

11. A semiconductor memory device according to claim 10, wherein the internal address signal generation circuit includes a counter for counting up the address signal supplied from the selection circuit and generating the internal address signal.

12. A semiconductor memory device comprising:

a memory cell array having a plurality of memory cells;

an internal address signal generation circuit for generating an internal address signal for accessing the memory cell array; and a plurality of protect circuits, each of the protect circuits including:

a first external address latch circuit for latching a first protective address signal supplied from outside;

a second external address latch circuit for latching a second protective address signal supplied from outside; and a comparison circuit for comparing the first protective address signal latched in the first external address latch circuit and the internal address signal generated from the internal address signal generation circuit to generate a comparison output signal and control an output of the comparison output signal in response to the second protective address signal latched in the second external address latch circuit; and a logic circuit for inhibiting access to at least part of the memory cell array in response to the comparison output signal generated from the comparison circuit.

13. A semiconductor memory device according to claim 12, further comprising:

a selection circuit for receiving an external address signal from outside and supplying the external address signal to the internal address signal generation circuit when the memory cell array is accessed.

14. A semiconductor memory device according to claim 13, further comprising:

a multiplexer connected to the selection circuit, the multiplexer sorting external address signals supplied from the selection circuit, in a redundant test mode;

a first decoder connected to the multiplexer, the first decoder selecting the first external latch circuit of one of the plurality of protect circuits in response to a first external address signal supplied from the multiplexer; and a second decoder connected to the multiplexer, the second decoder selecting the second external latch circuit of one of the plurality of protect circuits in response to a second external address signal supplied from the multiplexer.

15. A semiconductor memory device according to claim 13, wherein the internal address signal generation circuit includes a counter for counting up the address signal supplied from the selection circuit and generating the internal address signal.

16. A semiconductor memory device comprising:

a memory cell array having a plurality of memory cells;

a redundant memory cell array configured to replace a part of the memory cell array;

an internal address signal generation circuit for generating an internal address signal for accessing the memory cell array based on an address signal from outside;

a defective address storage circuit for storing a defective address signal for replacing the part of the memory cell array;

a first comparison circuit for comparing the internal address signal generated from the internal address signal generation circuit and the defective address signal stored in the defective address storage circuit, the first comparison circuit outputting a coincidence signal for replacing the part of the memory cell array;

a redundant memory test circuit for testing the redundant memory cell array, the redundant memory test circuit holding an address signal of the memory cell array, and setting the memory cell array in a nonselective state and setting the redundant memory cell array in a selective state when the address signal held in the redundant memory test circuit and the internal address signal generated from the internal address signal generation circuit coincide with each other; and a protect circuit for protecting the memory cell array, the protect circuit holding an address signal of the memory cell array, and inhibiting access to at least part of the memory cell array when the address signal held in the protect circuit and the internal address signal generated from the internal address signal generation circuit coincide with each other.

17. A semiconductor memory device according to claim 16, wherein the redundant memory test circuit comprises:

a latch circuit for latching an address signal of the memory cell array;

a second comparison circuit for comparing the address signal latched in the latch circuit and the internal address signal generated from the internal address signal generation circuit, the second comparison circuit outputting a coincidence signal when the address signal and the internal address signal coincide with each other; and a logic circuit for setting the memory cell array in the nonselective state and setting the redundant memory cell array in the selective state in response to the coincidence signal output from the second comparison circuit.

18. A semiconductor memory device according to claim 16, wherein the protect circuit comprises:

a first external address latch circuit for latching a first protective address signal supplied from outside;

a second external address latch circuit for latching a second protective address signal supplied from outside; and a comparison circuit for comparing the first protective address signal latched in the first external address latch circuit and the internal address signal generated from the internal address signal generation circuit to generate a comparison output signal and control an output of the comparison output signal in response to the second protective address signal latched in the second external address latch circuit; and a logic circuit for inhibiting access to at least part of the memory cell array in response to the comparison output signal generated from the comparison circuit.

19. A semiconductor memory device comprising:

a memory cell array having a plurality of memory cells;

a redundant memory cell array configured to replace part of the memory cell array;

an internal address signal generation circuit for generating an internal address signal for accessing the memory cell array based on an address signal from outside;

a defective address storage circuit for storing a defective address signal for replacing the part of the memory cell array;

a first comparison circuit for comparing the internal address signal generated from the internal address signal generation circuit and the defective address signal stored in the defective address storage circuit;

a first latch circuit for latching a testing address signal supplied from outside in a redundant test mode;

a second comparison circuit for comparing the testing address signal latched in the first latch circuit and the internal address signal generated from the internal address signal generation circuit;

a selection circuit supplied with an output signal of the first comparison circuit and an output signal of the second comparison circuit, the selection circuit selecting the output signal of the first comparison circuit when the memory cell array is accessed and selecting the output signal of the second comparison circuit in the redundant test mode;

a first logic circuit for setting the memory cell array in a nonselective state and setting the redundant memory cell array in a selective state in response to an output signal of the selection circuit;

a second latch circuit for latching a first protective address signal supplied from outside;

a third latch circuit for latching a second protective address signal supplied from outside;

a third comparison circuit supplied with the internal address signal from the internal address signal generation circuit, the first protective address signal from the second latch circuit, and the second protective address signal from the third latch circuit, the third comparison circuit comparing the first protective address signal and the internal address signal to generate a comparison output signal, the comparison output signal being controlled in response to the second protective address signal; and a second logic circuit supplied with the comparison output signal from the third comparison circuit, the second logic circuit inhibiting access to a region of the memory cell array, addressed by the second protective address signal, when the first protective address signal and the internal address signal coincide with each other.

20. A semiconductor memory device according to claim 19, further comprising:

a selection circuit for receiving an external address signal from outside and supplying the external address signal to the internal address signal generation circuit when the memory cell array is accessed.

21. A semiconductor memory device according to claim 20, further comprising:

a multiplexer connected to the selection circuit, the multiplexer sorting external address signals supplied from the selection circuit, in the redundant test mode;

a first decoder connected to the multiplexer, the first decoder selecting the first latch circuit in response to a first external address signal supplied from the multiplexer; and a second decoder connected to the multiplexer, the second decoder selecting the second latch circuit in response to a second external address signal supplied from the multiplexer.

* * * * *